United States Patent
Lee et al.

(10) Patent No.: US 12,362,320 B2
(45) Date of Patent: *Jul. 15, 2025

(54) SEMICONDUCTOR PACKAGE STRUCTURE

(71) Applicant: Advanced Semiconductor Engineering, Inc., Kaohsiung (TW)

(72) Inventors: Chien-Chi Lee, Kaohsiung (TW); Jyan-Ann Hsia, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/367,423

(22) Filed: Sep. 12, 2023

(65) Prior Publication Data

US 2023/0420416 A1 Dec. 28, 2023

Related U.S. Application Data

(63) Continuation of application No. 17/357,851, filed on Jun. 24, 2021, now Pat. No. 11,756,927.

(51) Int. Cl.
*H01L 25/065* (2023.01)

(52) U.S. Cl.
CPC .... *H01L 25/0652* (2013.01); *H01L 2225/06506* (2013.01); *H01L 2225/06513* (2013.01); *H01L 2225/06517* (2013.01); *H01L 2225/0652* (2013.01); *H01L 2225/06527* (2013.01)

(58) Field of Classification Search
None
See application file for complete search history.

(56) References Cited

U.S. PATENT DOCUMENTS

| | | |
|---|---|---|
| 9,761,559 B1 | 9/2017 | Shih et al. |
| 11,961,823 B1 * | 4/2024 | Jain ............... H01L 25/0657 |
| 12,079,475 B1 * | 9/2024 | Mathuriya .......... G11C 11/4093 |
| 2017/0062383 A1 | 3/2017 | Yu et al. |
| 2019/0363715 A1 | 11/2019 | Lee et al. |
| 2020/0098724 A1 * | 3/2020 | Liff ............... H01L 23/36 |

(Continued)

OTHER PUBLICATIONS

Gupta et al., "Ultra-thin chips for high-performance flexible electronics", npj Flexible Electronics (2018)2:8, 18 pages.

(Continued)

*Primary Examiner* — Nicholas J Tobergte
*Assistant Examiner* — William Henry Anderson
(74) *Attorney, Agent, or Firm* — FOLEY & LARDNER LLP

(57) ABSTRACT

A semiconductor package structure is provided. The semiconductor package structure includes a carrier, a first electronic component, a second electronic component, a third electronic component, a fourth electronic component, and a connection element. The first electronic component is disposed over a surface of the carrier. The second electronic component is disposed over the first electronic component. The third electronic component is spaced apart from the first electronic component and disposed over the surface of the carrier. The fourth electronic component is disposed over the third electronic component. The connection element is electrically connecting the second electronic component to the fourth electronic component.

14 Claims, 7 Drawing Sheets

(56) References Cited

U.S. PATENT DOCUMENTS

| | | |
|---|---|---|
| 2020/0144170 A1 | 5/2020 | Yazdani |
| 2020/0161242 A1 | 5/2020 | Lin et al. |
| 2020/0272564 A1 | 8/2020 | Keeth et al. |
| 2021/0296242 A1* | 9/2021 | Hossain .................. H01L 23/13 |
| 2022/0028848 A1* | 1/2022 | Baek .................. H01L 23/5383 |
| 2022/0199556 A1 | 6/2022 | Zhou et al. |
| 2022/0359464 A1* | 11/2022 | Zaman ................ G06F 13/4022 |
| 2022/0399277 A1* | 12/2022 | Elsherbini ............... H01L 25/50 |

OTHER PUBLICATIONS

Non-Final Office Action for U.S. Appl. No. 17/357,851, issued Jan. 4, 2023, 16 pages.
Notice of Allowance for U.S. Appl. No. 17/357,851, issued May 3, 2023, 9 pages.

\* cited by examiner

SEMICONDUCTOR PACKAGE STRUCTURE

CROSS-REFERENCE TO RELATED APPLICATION

This application is a continuation of U.S. patent application Ser. No. 17/357,851, filed Jun. 24, 2021, the content of which is incorporated herein by reference in its entirety.

BACKGROUND

1. Technical Field

The present disclosure relates generally to a semiconductor package structure, and particularly to a semiconductor package structure including a connection element electrically connecting two electronic components.

2. Description of the Related Art

In edge computing, high performance computing, automotive intelligence computing, artificial intelligence, and other related technologies, the requirement for data transmission speed has significantly increased over time. To fulfill demand for increased data transmission speed, a semiconductor package are fitted with increased numbers of application-specific integrated circuit (ASICs) and memories. As a result, it has become increasingly difficult to integrate more components in a semiconductor package to meet the desired functions.

SUMMARY

In some arrangements, a semiconductor package structure includes a carrier, a first electronic component, a second electronic component, a third electronic component, a fourth electronic component, and a connection element. The first electronic component is disposed over a surface of the carrier. The second electronic component is disposed over the first electronic component. The third electronic component is spaced apart from the first electronic component and disposed over the surface of the carrier. The fourth electronic component is disposed over the third electronic component. The connection element is electrically connecting the second electronic component to the fourth electronic component.

In some arrangements, a semiconductor package structure includes a processing element, a non-processing element, and a connection element. The non-processing element is spaced apart from the processing element and at an elevation different from an elevation of the processing element. The connection element is electrically connecting the processing element to the non-processing element.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
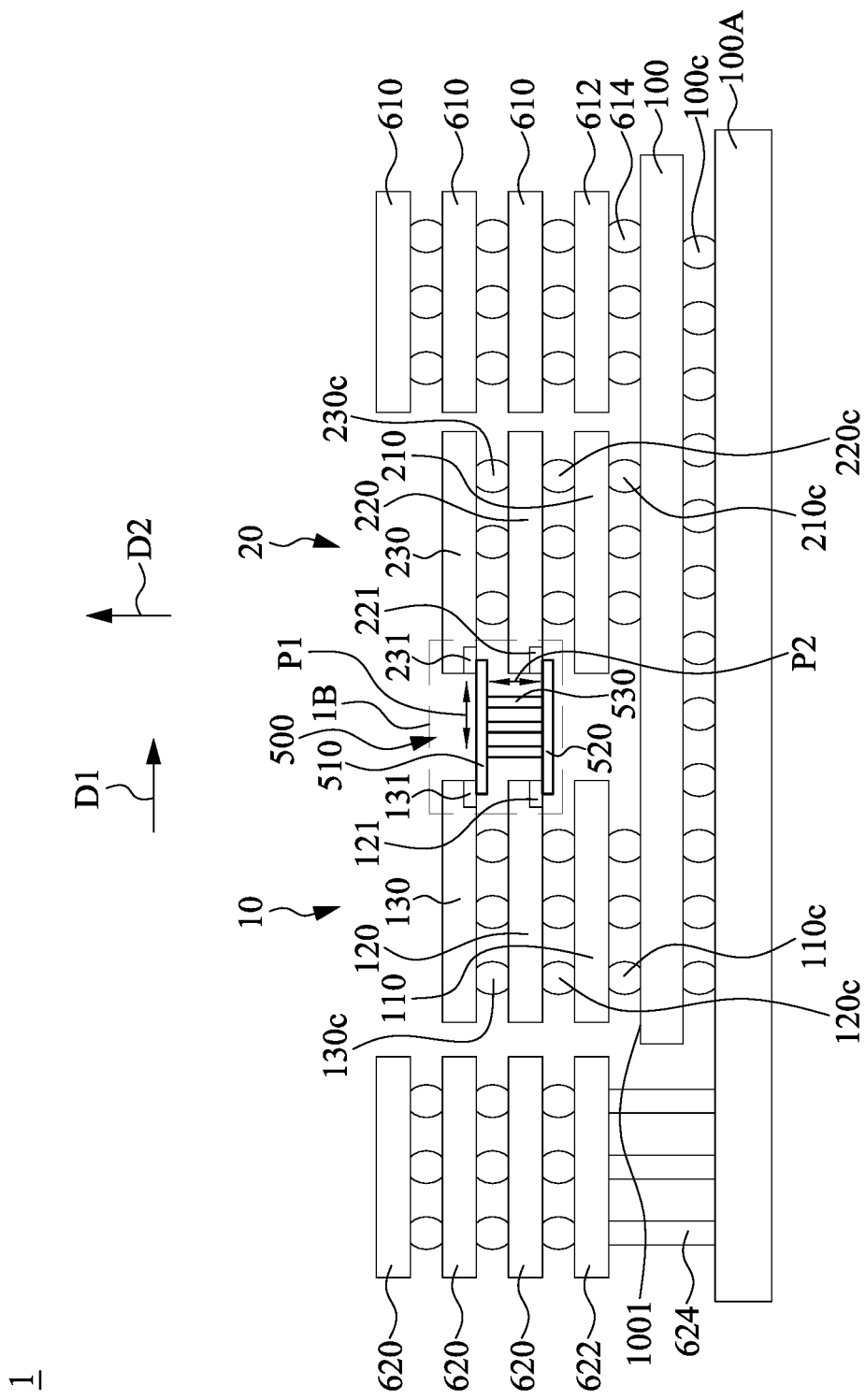
FIG. 1A illustrates a cross-sectional view of a semiconductor package structure in accordance with some arrangements of the present disclosure.

FIG. 1A illustrates a cross-sectional view of a semiconductor package structure 1 in accordance with some arrangements of the present disclosure. The semiconductor package structure 1 includes a carrier 100A, a substrate 100, electronic modules 10 and 20, a connection element 500, storage elements 610 and 620, and processing elements 612 and 622.

The carrier 100A may be or include a substrate. Examples of the substrate include a printed circuit board, such as a paper-based copper foil laminate, a composite copper foil laminate, and a polymer-impregnated glass-fiber-based copper foil laminate. The carrier 100A may be or include an interconnection structure including, for example, one or more conductive traces and/or one or more through vias. In some arrangements, the carrier 100A may be or include at least one of a ceramic material, an organic substrate, or a metal plate. In some arrangements, the carrier 100A may be or include a printed circuit board (PCB).

The substrate 100 is disposed over the carrier 100A (along or parallel to direction D2 with respect to the carrier 100A) and electrically connected to the carrier 100A. The substrate 100 may be electrically connected to the carrier 100A through conductive elements 100c. The conductive elements 100c may be or include conductive bumps, solder balls, conductive pillars, or so on. The substrate 100 may be or include, for example, a PCB, such as a paper-based copper foil laminate, a composite copper foil laminate, or a polymer-impregnated glass-fiber-based copper foil laminate. The substrate 100 may be or include an interconnection structure including, for example, one or more conductive traces and/or one or more through vias. In some arrangements, the substrate 100 may be or include a redistribution layer (RDL) or a fan-out substrate. In some arrangements, the substrate 100 may be or include at least one of a ceramic material, an organic substrate, or a metal plate. In some arrangements, the substrate 100 includes an interposer.

The electronic module 10 (e.g., a functional stack) is disposed over the substrate 100 (along or parallel to direction D2 with respect to the substrate 100). The electronic module 10 is electrically connected to the substrate 100. The electronic module 10 may include a plurality of electronic components 110, 120, and 130. Although three electronic components are illustrated in FIG. 1A, the electronic module 10 may include any suitable number of electronic components, for example, in a stacked configuration similar to that of electronic components 110, 120, and 130. As show, the electronic components 110, 120, and 130 are disposed in a stacked configuration or arrangement along or parallel to direction D2. For example, the electronic component 120 is disposed over the electronic component 110 along or parallel to direction D2, and the electronic component 130 is disposed over the electronic component 120 along or parallel to direction D2. In some arrangements, the electronic components 110, 120, and 130 are disposed over a top surface of the carrier 100A along or parallel to direction D2. In some arrangements, the electronic components 110, 120, and 130 are disposed at the same side of the carrier 100A and face the top surface of the carrier 100A.

The electronic module 20 (e.g., a functional stack) is disposed over the substrate 100 (along or parallel to direction D2 with respect to the substrate 100). As shown, the electronic modules 10 and 20 are physically separate and spaced apart from each other. For example, the electronic modules 10 and 20 have a gap therebetween. The electronic module 20 is electrically connected to the substrate 100. The electronic module 20 may include a plurality of electronic components 210, 220, and 230. Although three electronic components are illustrated in FIG. 1A, the electronic module 20 may include any suitable number of electronic components, for example, in a stacked configuration similar to that of electronic components 210, 220, and 230. The number of the electronic components of the electronic module 10 may be the same or different from the number of electronic components of the electronic module 20. As shown, the electronic components 210, 220, and 230 are disposed in a stacked configuration or arrangement along or parallel to direction D2. For example, the electronic component 220 is disposed over the electronic component 210 along or parallel to direction D2, and the electronic component 230 is disposed over the electronic component 220 along or parallel to direction D2. In some arrangements, the electronic components 110, 120, 130, 210, 220, and 230 are disposed over the top surface of the carrier 100A along or parallel to direction D2. In some arrangements, the electronic components 110, 120, 130, 210, 220, and 230 are disposed at the same side of the carrier 100A and face the same top surface of the carrier 100A.

The electronic component 110 is disposed over the substrate 100 along or parallel to direction D2. The electronic component 110 may be electrically connected to the substrate 100 through conductive elements 110c. The conductive elements 110c may be or include conductive bumps, conductive vias, conductive pillars, conductive studs, or so on.

The electronic component 210 is disposed over the substrate 100 along or parallel to direction D2. The electronic component 210 is physically separate and spaced apart from the electronic component 110 with a gap therebetween. The electronic component 210 may be arranged side-by-side with the electronic component 110. For example, an imaginary line that is substantially parallel to the top and/or bottom surface of the substrate 100 traverses both the electronic component 110 and the electronic component 210. In some examples, top surfaces of the electronic components 110 and 210 are on or substantially a same plane, where the plane is substantially parallel to the top and/or bottom surface of the substrate 100. In some examples, bottom surfaces of the electronic components 110 and 210 are on or substantially a same plane, where the plane is substantially parallel to the top and/or bottom surface of the substrate 100.

In some arrangements, the electronic component 110 and the electronic component 210 are at a substantially same elevation with respect to the substrate 100. As used herein, in some examples, an elevation of a component with respect to a substrate refers to a distance between a bottom surface of the component and a top surface (e.g., the surface 1001) of the substrate along an axis perpendicular to the top surface of the substrate (e.g., an axis parallel to D2), where the bottom surface of the component and the top surface of the substrate face each other. In some examples, an elevation of a component with respect to a substrate refers to a distance between the bottom surface of the component and a bottom surface of the substrate along an axis perpendicular to the top surface of the substrate (e.g., an axis parallel to D2), where the bottom surface of the substrate is opposite to the top surface of the substrate. In some examples, an elevation of a component with respect to a substrate refers to a distance between a top surface of the component and the top or bottom surface of the substrate along an axis perpendicular to the top surface of the substrate (e.g., an axis parallel to D2), where the top surface of the component is opposite to the bottom surface of the component. In some other arrangements, the electronic component 210 may be at an elevation different from an elevation of the electronic component 110. The electronic component 210 may be electrically connected to the substrate 100 through conductive elements 210c. The conductive elements 210c may be or include conductive bumps, conductive vias, conductive pillars, conductive studs, or so on.

The electronic component 120 is disposed over the substrate 100 along or parallel to direction D2. The electronic component 120 may be disposed over the electronic component 110 along or parallel to direction D2. The electronic component 120 is electrically connected to the electronic component 110. The electronic component 120 may be electrically connected to the electronic component 110 through conductive elements 120c. The conductive elements 120c may be or include conductive bumps, conductive vias, conductive pillars, conductive studs, or so on. In some arrangements, the electronic component 120 includes an I/O module 121.

The electronic component 220 is disposed over the substrate 100 along or parallel to direction D2. The electronic component 220 is physically separate and spaced apart from the electronic component 120 with a gap therebetween. The electronic component 220 may be arranged side-by-side with the electronic component 120. For example, an imaginary line that is substantially parallel to the top and/or bottom surface of the substrate 100 traverses both the electronic component 120 and the electronic component 220. In some examples, top surfaces of the electronic components 120 and 220 are on or substantially a same plane, where the plane is substantially parallel to the top and/or bottom surface of the substrate 100. In some examples, bottom surfaces of the electronic components 120 and 220 are on or substantially a same plane, where the plane is substantially parallel to the top and/or bottom surface of the substrate 100.

In some arrangements, the electronic component 120 and the electronic component 220 are at a substantially same elevation with respect to the substrate 100. The electronic component 220 may be disposed over the electronic component 210 along or parallel to direction D2. The electronic component 220 may be electrically connected to the electronic component 210. The electronic component 220 may be electrically connected to the electronic component 210 through conductive elements 220c. The conductive elements 220c may be or include conductive bumps, conductive vias, conductive pillars, conductive studs, or so on. In some arrangements, the electronic component 220 includes an I/O module 221.

The electronic component 130 is disposed over the substrate 100 along or parallel to direction D2. The electronic component 130 may be disposed over the electronic component 120 along or parallel to direction D2. The electronic component 130 is electrically connected to the electronic component 120. The electronic component 130 may be electrically connected to the electronic component 120 through conductive elements 130c. The conductive elements 130c may be or include conductive bumps, conductive vias, conductive pillars, conductive studs, or so on. In some arrangements, the electronic component 130 includes an I/O module 131.

The electronic component 230 is disposed over the substrate 100 along or parallel to direction D2. The electronic component 230 is physically separate and spaced apart from the electronic component 130 with a gap therebetween. The electronic component 230 may be arranged side-by-side with the electronic component 130. For example, an imaginary line that is substantially parallel to the top and/or bottom surface of the substrate 100 traverses both the electronic component 130 and the electronic component 230. In some examples, top surfaces of the electronic components 130 and 230 are on or substantially a same plane, where the plane is substantially parallel to the top and/or bottom surface of the substrate 100. In some examples, bottom surfaces of the electronic components 130 and 320 are on or substantially a same plane, where the plane is substantially parallel to the top and/or bottom surface of the substrate 100.

In some arrangements, the electronic component 130 and the electronic component 230 are at a substantially same elevation with respect to the substrate 100. The electronic component 230 may be disposed over the electronic component 220 along or parallel to direction D2. The electronic component 230 may be electrically connected to the electronic component 220. The electronic component 230 may be electrically connected to the electronic component 220 through conductive elements 230c. The conductive elements 230c may be or include conductive bumps, conductive vias, conductive pillars, conductive studs, or so on. In some arrangements, the electronic component 230 includes an I/O module 231.

Each of the electronic components 110, 120, 130, 210, 220, and 230 may be or include an active component. In some arrangements, each of the electronic components 110, 120, 130, 210, 220, and 230 may include a processing element, a non-processing element (e.g., a storage/memory device), or a combination thereof. In some arrangements, each of the electronic components 120, 130, 220, and 230 includes at least one of a processing unit, a non-processing element (e.g., a storage/memory unit), an input/output (I/O) unit or a communication unit. In some arrangements, one or more of the electronic components 110, 120, 130, 210, 220, and 230 may be configured to transmit high-speed data. In some arrangements, one or more of the electronic components 110, 120, 130, 210, 220, and 230 may include a central processing unit (CPU), a microcontroller unit (MCU), a graphics processing unit (GPU), an ASIC, or so on. In some arrangements, one or more of the electronic components 110, 120, 130, 210, 220, and 230 may be or include a random access memory (RAM), such as a static random access memory (SRAM), or another suitable storage/memory device.

In some arrangements, the electronic components 110, 120, and 130 are used to construct a functional stack (e.g., the electronic module 10). Similarly, the electronic components 210, 220, and 230 are used to construct a functional stack (e.g., the electronic module 20). Each functional stack includes at least one processing unit and at least one storage device (e.g., in one or more of the electronic components therein). In some arrangements, the electronic component 110/210 is a processing unit, and the electronic components 120/220 and 130/230 are storage devices that are stacked together, such that the manufacturing process for forming the storages devices that are stacked together in the functional stack can be relatively simplified. Accordingly, the yield of the semiconductor package structure 1 can be increased. In some arrangements, the electronic components 110 and 130 are processing units, and the electronic component 120 is a storage device. Such arrangements can increase data transmission rate due to the reduced transmission paths between the processing units 110 and 130 and the storage device 120. While three electronic components are included in one electronic module as illustrated in FIG. 1A, each electronic module 10 or 20 can include any number of electronic components, and different electronic modules may include different numbers of electronic components.

In some arrangements, the connection element 500 electrically connects the electronic module 10 with the electronic module 20. The connection element 500 may electrically connect any of the electronic components of the electronic module 10 with any of the electronic components of the electronic module 20. The connection element 500 may provide a connection (e.g., a signal path or a transmission path) between the electronic module 10 and the electronic module 20 (e.g., the electronic components thereof) without passing the substrate 100. In other words, the connection provided by the connection element 500 is different from and external to the substrate 100. For example, the connection between the electronic module 10 and the electronic module 20 provided by the connection element 500 corresponds to a horizontal direction (e.g., along or parallel to D1) or an oblique direction across (or over/above) the substrate 100. The oblique direction is oblique to the top and/or bottom surfaces of the substrate 100 in some examples. In some examples, the oblique direction is oblique to one or both of D1 and D2. In some arrangements, the connection element 500 electrically connects the electronic component 110 to the electronic component 210. In some arrangements, the connection element 500 electrically connects the electronic component 110 to the electronic component 220. In some arrangements, the connection element 500 electrically connects the electronic component 120 to the electronic component 210. In some arrangements, the connection element 500 electrically connects the electronic component 120 to the electronic component 220. In some arrangements, the connection element 500 electrically connects the electronic component 130 to the electronic component 220. In some arrangements, the connection element 500 electrically connects the electronic component 230 to the electronic component 120. In some arrangements, the connection element 500 electrically connects the electronic component 130 to the electronic component 230. In some arrangements, the connection element 500 may be or include a bridging device.

In some arrangements, the connection element 500 directly connects the I/O module 121 of the electronic component 120 to the I/O module 221 of the electronic component 220. In some arrangements, the connection element 500 directly connects the I/O module 131 of the electronic component 130 to the I/O module 231 of the electronic component 230. In some arrangements, the connection element 500 directly connects the I/O module 121 of the electronic component 120 to the I/O module 231 of the electronic component 230. In some arrangements, the connection element 500 directly connects the I/O module 131 of the electronic component 130 to the I/O module 221 of the electronic component 220.

The connection element 500 may be configured to control data transmitted between the electronic module 10 (e.g., electronic component 120 and/or 130) and the electronic module 20 (e.g., the electronic component 220 and/or 230) through the connection element 500 without passing the substrate 100. The connection element 500 may be configured to control data transmitted between one or more of the electronic components in the functional stack (e.g., the electronic module 10) and one or more of the electronic components in the functional stack (e.g., the electronic module 20) through the connection element 500 without passing the substrate 100. In some arrangements, the connection element 500 is configured to control data transmitted between the electronic component 120, the electronic component 130, the electronic component 220, and the electronic component 230 without passing the substrate 100. In some arrangements, the connection element 500 includes an active component. In some arrangements, the active component includes a multiplexer. The multiplexer may be configured to control data transmitted between the electronic component 120 and/or 130 and the electronic component 220 and/or 230 through the connection element 500 without passing the substrate 100. In some arrangements, the connection element 500 may include a controller configured to control data transmission. In some arrangements, the connection element 500 may include a controller configured to control data transmitted between the electronic component 120 and/or 130 and the electronic component 220 and/or 230 through the connection element 500 without passing the substrate 100.

In some arrangements, the connection element 500 is configured to transmit data between the electronic component 130 and the electronic component 220 at least in a direction D1 and a direction D2 different from the direction D1. In other words, the connection element 500 is configured to transmit data between two electronic components (e.g., the electronic component 130 and the electronic component 220) with corresponding relative positions defined using at least two directions (e.g., a direction D1 and a direction D2 different from the direction D1). In some arrangements, the connection element 500 is configured to transmit data between the electronic component 120 and the electronic component 230 at least in the direction D1 and the direction D2. In other words, the connection element 500 is configured to transmit data between the electronic component 120 and the electronic component 230 with corresponding relative positions defined using the direction D1 and the direction D2. In some arrangements, the direction D1 and the direction D2 are not perpendicular and define an angle less than 180 degrees. In some arrangements, the direction D1 is perpendicular to the direction D2.

The connection element 500 may be configured to control transmission paths between four electronic components (e.g., the electronic component 120, the electronic component 130, the electronic component 220, and the electronic component 230). In some arrangements, the connection element 500 includes a transmission path P1 (e.g., a horizontal transmission path) substantially parallel to a surface 1001 of the substrate 100 and a transmission path P2 (e.g., a vertical horizontal transmission path) substantially perpendicular to the surface 1001 of the substrate 100. The connection element 500 also includes a transmission path P3 as shown and described in further detail with respect to FIG. 1B. In some arrangements, the connection element 500 is configured to transmit the data between the electronic component 130 and the electronic component 220 through at least the transmission paths P1 and P2. In some arrangements, the connection element 500 is configured to transmit the data between the electronic component 120 and the electronic component 230 through at least the transmission paths P1 and P2.

In some arrangements, the connection element 500 includes bridging elements 510 and 520 and one or more connective elements 530. The connective element 530 may be connected to the bridging element 510 and/or the bridging element 520. In some arrangements, the bridging element 510 is configured to transmit data in at least a direction along or parallel to the direction D1. In some arrangements, the bridging element 520 is configured to transmit data in at least a direction along or parallel to the direction D1. In some arrangements, the bridging elements 510 and 520 are configured to transmit data along or parallel to at least direction different from the direction D2 or any direction parallel thereto. In some arrangements, the connective elements 530 is configured to transmit data in at least a direction along or parallel to the direction D2. The bridging element 520 may be electrically connected to the bridging element 510 through the connective elements 530. In some other arrangements (not shown in FIG. 1A), the bridging element 520 may be configured to transmit data in a direction different from and non-parallel to both direction by which the bridging element 510 transmits data and the direction by which the bridging element 530 transmits data. In some arrangements, each of the bridging elements 510 and 520 may include a capacitor and an active component. In some arrangements, the active component of each of the bridging elements 510 and 520 includes a multiplexer. In some arrangements, the connective elements 530 may include one or more conductive pillars.

The connection element 500 may be configured to control a data rate and/or a bandwidth of a transmission path of the data transmitted between the electronic module 10 (e.g., electronic component 120 and/or 130) and the electronic module 20 (e.g., the electronic component 220 and/or 230) through the connection element 500 without passing the substrate 100. In some arrangements, the connection element 500 is configured to control a data rate and/or a bandwidth of each of the transmission paths of the data transmitted among the electronic component 120, the electronic component 130, the electronic component 220, and the electronic component 230 without passing the substrate 100. In some arrangements, the connection element 500 may include a controller configured to control a data rate and/or a bandwidth of each of the transmission paths of the data transmitted among the electronic component 120, the electronic component 130, the electronic component 220, and the electronic component 230 without passing the substrate 100.

In some arrangements, the connection element 500 is configured to control a data rate of the data transmitted between two of the electronic component 120, the electronic component 130, the electronic component 220, and the electronic component 230 different from a data rate of the data transmitted between two other ones of the electronic component 120, the electronic component 130, the electronic component 220, and the electronic component 230.

In some arrangements, the connection element 500 is configured to adjust bandwidths of the transmission paths between the electronic component 120, the electronic component 130, the electronic component 220, and the electronic component 230. In some arrangements, the connection element 500 may include a controller configured to adjust bandwidths of the transmission paths between the electronic component 120, the electronic component 130, the electronic component 220, and the electronic component 230.

In some arrangements, the connection element 500 is configured to control a bandwidth of a transmission path between two of the electronic component 120, the electronic component 130, the electronic component 220, and the electronic component 230 different from a bandwidth of a transmission path between two other ones of electronic component 120, the electronic component 130, the electronic component 220, and the electronic component 230.

In some arrangements, as shown, at least a portion of the connection element 500 is disposed between the electronic component 110 and the electronic component 120, in the physical gap between the electronic components 110 and 120. In some arrangements, at least a portion of the connection element 500 is disposed between the electronic component 120 and the electronic component 130. In some arrangements, at least a portion of the connection element 500 is disposed between the electronic component 210 and the electronic component 220. In some arrangements, at least a portion of the connection element 500 is disposed between the electronic component 220 and the electronic component 230. In some other arrangements, the connection element 500 includes a built-up circuit layer, an interposer, a flexible substrate, a bonding wire, an optical fiber, or a combination thereof.

In some arrangements, the storage elements 610 and the processing element 612 are disposed over the substrate 100 along or parallel to direction D2. In some arrangements, the storage elements 610 are stacked over along or parallel to direction D2 and electrically connected to the processing element 612, and the processing element 612 is electrically connected to the substrate 100 through conductive elements 614. In some arrangements, the storage elements 610 and the processing element 612 are electrically connected to the electronic modules 10 and 20 through the substrate 100. In some arrangements, the storage elements 620 and the processing element 622 are disposed over the carrier 100A along or parallel to direction D2. In some arrangements, the storage elements 620 are stacked over along or parallel to direction D2 and electrically connected to the processing element 622, and the processing element 622 is electrically connected to the carrier 100A through conductive elements 624. In some arrangements, the storage elements 620 and the processing element 622 are electrically connected to the electronic modules 10 and 20 through the carrier 100A. Each of the storage elements 610 and 620 may be or include high-bandwidth storage elements, such as high bandwidth memories (HBMs) and so on. Each of the processing elements 612 and 622 may be include memory controllers configured to control respective ones of the storage elements 610 and 620. The conductive elements 614 may be or include conductive bumps, and the conductive elements 624 may be or include conductive pillars, or another suitable type of conductive elements.

Figure 1B:
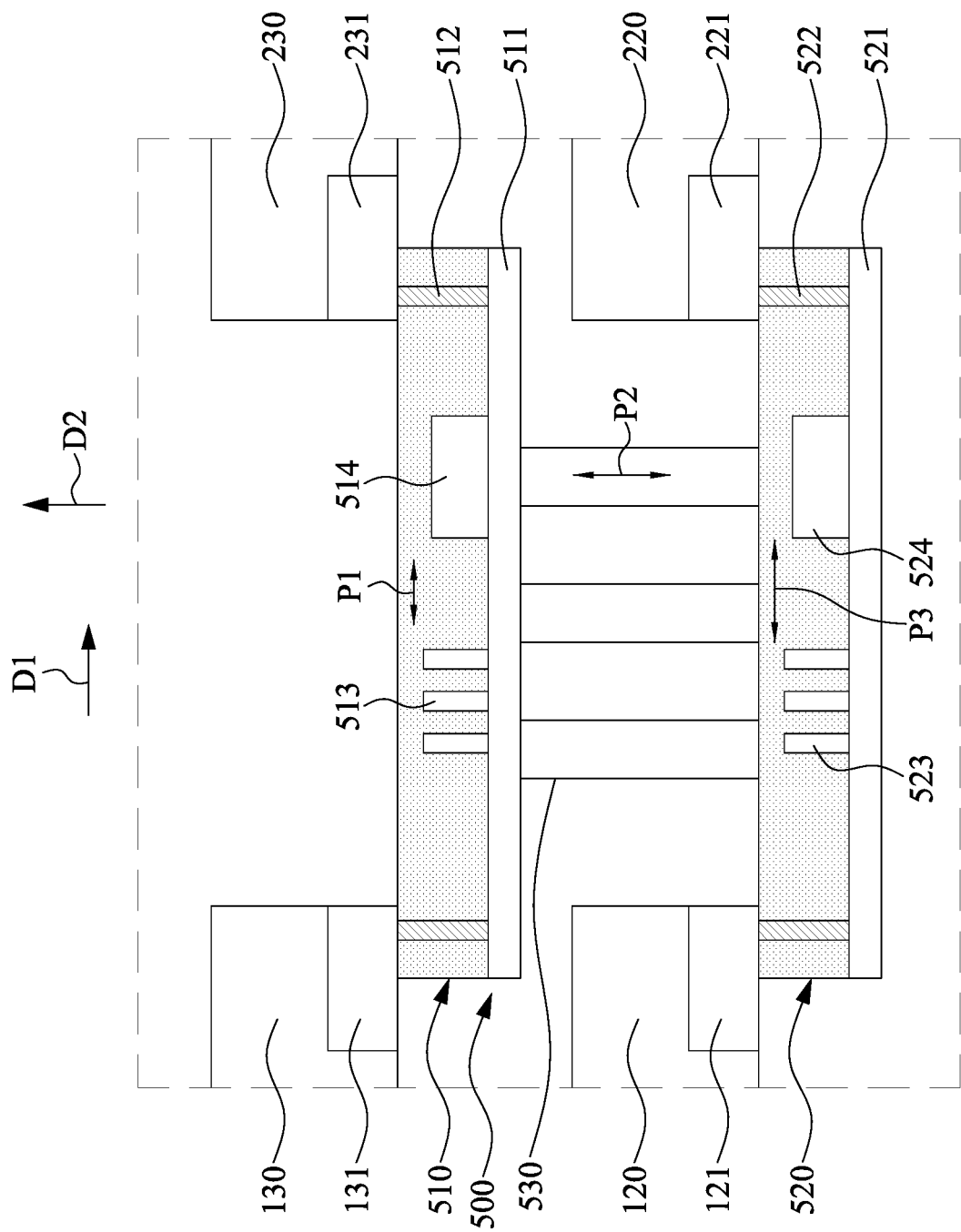
FIG. 1B illustrates a cross-sectional view of a portion of a semiconductor package structure in accordance with some arrangements of the present disclosure.

FIG. 1B illustrates a cross-sectional view of a portion 1B of the semiconductor package structure 1 shown in FIG. 1A, in accordance with some arrangements of the present disclosure.

As illustrated in FIG. 1B, in some arrangements, the connection element 500 includes a built-up circuit layer, an interposer, or a combination thereof. The connection element 500 may include bridging elements 510 and 520 and one or more connective elements 530.

In some arrangements, the bridging element 510 of the connection element 500 includes one or more capacitors 513 and an active component 514. While three capacitors 513 are shown in FIG. 1B, the bridging element 510 can include any suitable number of capacitors 513. In some arrangements, the bridging element 510 further includes a redistribution layer 511 electrically connecting to the capacitor 513 and the active component 514. In some arrangements, the bridging element 510 further includes one or more conductive through vias 512 passing through the bridging element 510 to electrically connect to the redistribution layer 511. The I/O modules 131 and 231 may be electrically connected to the redistribution layer 511 through the respective conductive through vias 512 as shown. In some arrangements, the bridging element 510 electrically connects the electronic component 130 to the electronic component 230 through a path including the I/O module 131 of the electronic component 130, the conductive through via 512, the redistribution layer 511, the conductive through via 512, and the I/O module 231 of the electronic component 230. In some arrangements, each capacitor 513 is or includes a deep trench capacitor. In some arrangements, each capacitor 513 may be or include a metal-dielectric laminate structure. The material of each capacitor 513 may be or include a dielectric (such as oxide) and/or a conductive material (such as polysilicon or metal). In some arrangements, the capacitor 513 may serve as a decoupling capacitor for filtering or reducing the noise from power supplies. In some arrangements, the active component 514 includes an amplifier, a modulator, a multiplexer, or a combination thereof. In some arrangements, the active component 514 may serve to stabilize the power transmitting through the bridging element 510, especially for long-distance transmission. In some arrangements, the active component 514 may be configured to control data transmitted between the electronic component 120, the electronic component 130, the electronic component 220, and the electronic component 230 without passing the substrate 100.

In some arrangements, the bridging element 520 of the connection element 500 includes a redistribution layer 521, one or more conductive through vias 522, one or more capacitors 523, and an active component 524. The redistribution layer 521, the conductive through via 522, the capacitor 523, and the active component 524 are similar to the redistribution layer 511, the conductive through via 512, the capacitor 513, and the active component 514, respectively, and thus the description thereof is omitted hereinafter. The I/O modules 121 and 221 may be electrically connected to the redistribution layer 521 through the respective conductive through vias 522 as shown. In some arrangements, the bridging element 520 electrically connects the electronic component 120 to the electronic component 220 through a path including the I/O module 121 of the electronic component 120, the conductive through via 522, the redistribution layer 521, the conductive through via 522, and the I/O module 221 of the electronic component 220. In some arrangements, the active component 524 may serve to stabilize the power transmitting through the bridging element 520, especially for long-distance transmission. In some arrangements, the active component 524 may be configured to control data transmitted between the electronic component 120, the electronic component 130, the electronic component 220, and the electronic component 230 without passing the substrate 100.

In some arrangements, the connective elements 530 may include one or more conductive pillars. In some arrangements, the connection element 500 includes transmission paths P1, P2, and P3. The transmission paths P1 and P3 are substantially parallel to the direction D1, and the transmission path P2 is substantially parallel to the direction D2. As shown, the transmission path P2 refers to three separate paths along the three separate connective elements 530. In some arrangements, the connection element 500 is configured to communicate (e.g., transmit) the data among the electronic component 120, the electronic component 130, the electronic component 220, and the electronic component 230 through the transmission paths P1, P2, and P3.

Figure 1C:
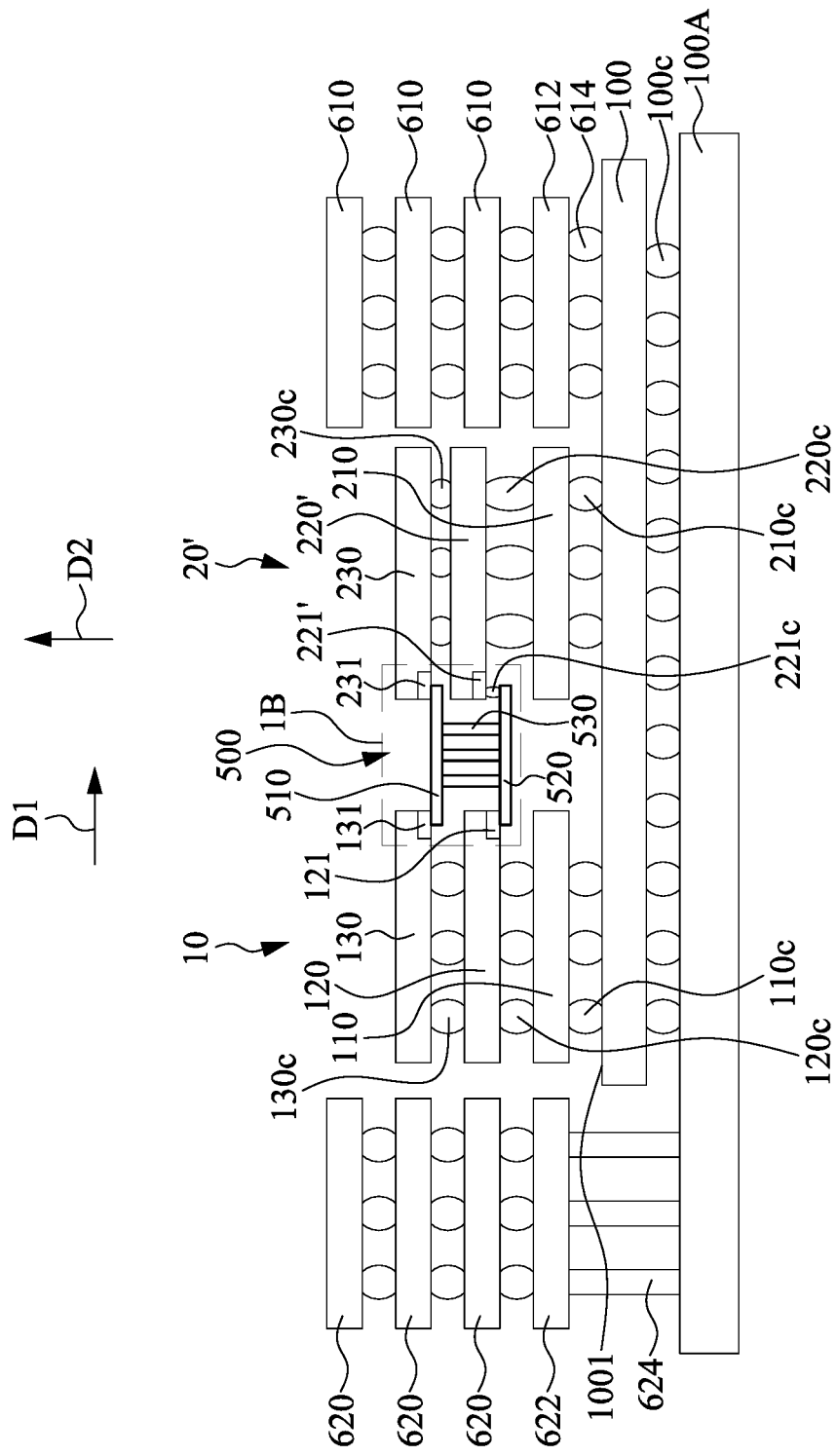
FIG. 1C illustrates a cross-sectional view of a semiconductor package structure in accordance with some arrangements of the present disclosure.

FIG. 1C illustrates a cross-sectional view of a semiconductor package structure 2 in accordance with some arrangements of the present disclosure. The semiconductor package structure 2 is similar to the semiconductor package structure 1 in FIG. 1A except that, for example, one functional stack (e.g., the electronic module 20') has a structure different from the structure of the electronic module 20.

In some arrangements, the electronic component 220' may be at an elevation different from an elevation of the electronic component 120. In some arrangements, the electronic component 120 and the electronic component 220' are at different elevations with respect to the substrate 100.

For example, as shown, a distance between a bottom surface of the electronic component 120 and a top surface (e.g., the surface 1001) of the substrate 100 along an axis perpendicular to the top surface of the substrate (e.g., an axis parallel to D2) and a distance between a bottom surface of the electronic component 220' and a top surface (e.g., the surface 1001) of the substrate 100 along an axis perpendicular to the top surface of the substrate (e.g., another axis parallel to D2) are different. The bottom surfaces of the components 120 and 220' and the top surface of the substrate face each other. As shown, the distance between a bottom surface of the electronic component 220' and the top surface (e.g., the surface 1001) of the substrate 100 is greater than the distance between a bottom surface of the electronic component 120 and the top surface of the substrate 100. In other examples not shown, the distance between the bottom surface of the electronic component 220' and the top surface (e.g., the surface 1001) of the substrate 100 is less than the distance between the bottom surface of the electronic component 120 and the top surface of the substrate 100.

In some examples, as shown, a distance between a bottom surface of the electronic component 120 and a bottom surface of the substrate 100 along an axis perpendicular to the top surface of the substrate (e.g., an axis parallel to D2) and a distance between a bottom surface of the electronic component 220' and the bottom top surface of the substrate 100 along an axis perpendicular to the bottom surface of the substrate (e.g., another axis parallel to D2) are different. The bottom surface of the substrate 100 is opposite to the top surface 1001 of the substrate 100. As shown, the distance between a bottom surface of the electronic component 220' and the bottom surface of the substrate 100 is greater than the distance between a bottom surface of the electronic component 120 and the bottom surface of the substrate 100. In other examples not shown, the distance between the bottom surface of the electronic component 220' and the bottom surface of the substrate 100 is less than the distance between the bottom surface of the electronic component 120 and the bottom surface of the substrate 100.

In some examples, as shown, a distance between a top surface of the electronic component 120 and a top surface (e.g., the surface 1001) of the substrate 100 along an axis perpendicular to the top surface of the substrate (e.g., an axis parallel to D2) and a distance between a top surface of the electronic component 220' and a top surface (e.g., the surface 1001) of the substrate 100 along an axis perpendicular to the top surface of the substrate (e.g., another axis parallel to D2) are different. The top surfaces of the components 120 and 220' and the bottom surfaces of the components 120 and 220' respectively face each other. As shown, the distance between the top surface of the electronic component 220' and the top surface of the substrate 100 is greater than the distance between the top surface of the electronic component 120 and the top surface of the substrate 100. In other examples not shown, the distance between the top surface of the electronic component 220' and the top surface of the substrate 100 is less than the distance between the top surface of the electronic component 120 and the top surface of the substrate 100.

In some examples, as shown, a distance between the top surface of the electronic component 120 and a bottom surface of the substrate 100 along an axis perpendicular to the top surface of the substrate (e.g., an axis parallel to D2) and a distance between the top surface of the electronic component 220' and the bottom top surface of the substrate 100 along an axis perpendicular to the bottom surface of the substrate (e.g., another axis parallel to D2) are different. As shown, the distance between the top surface of the electronic component 220' and the bottom surface of the substrate 100 is greater than the distance between the top surface of the electronic component 120 and the bottom surface of the substrate 100. In other examples not shown, the distance between the top surface of the electronic component 220' and the bottom surface of the substrate 100 is less than the distance between the top surface of the electronic component 120 and the bottom surface of the substrate 100.

In some arrangements, the I/O module 221' of the electronic component 220' is electrically connected to the connection element 500 through a conductive element 221c. The conductive element 221c may be or include a conductive bump, e.g., a micro bump.

Figure 2:
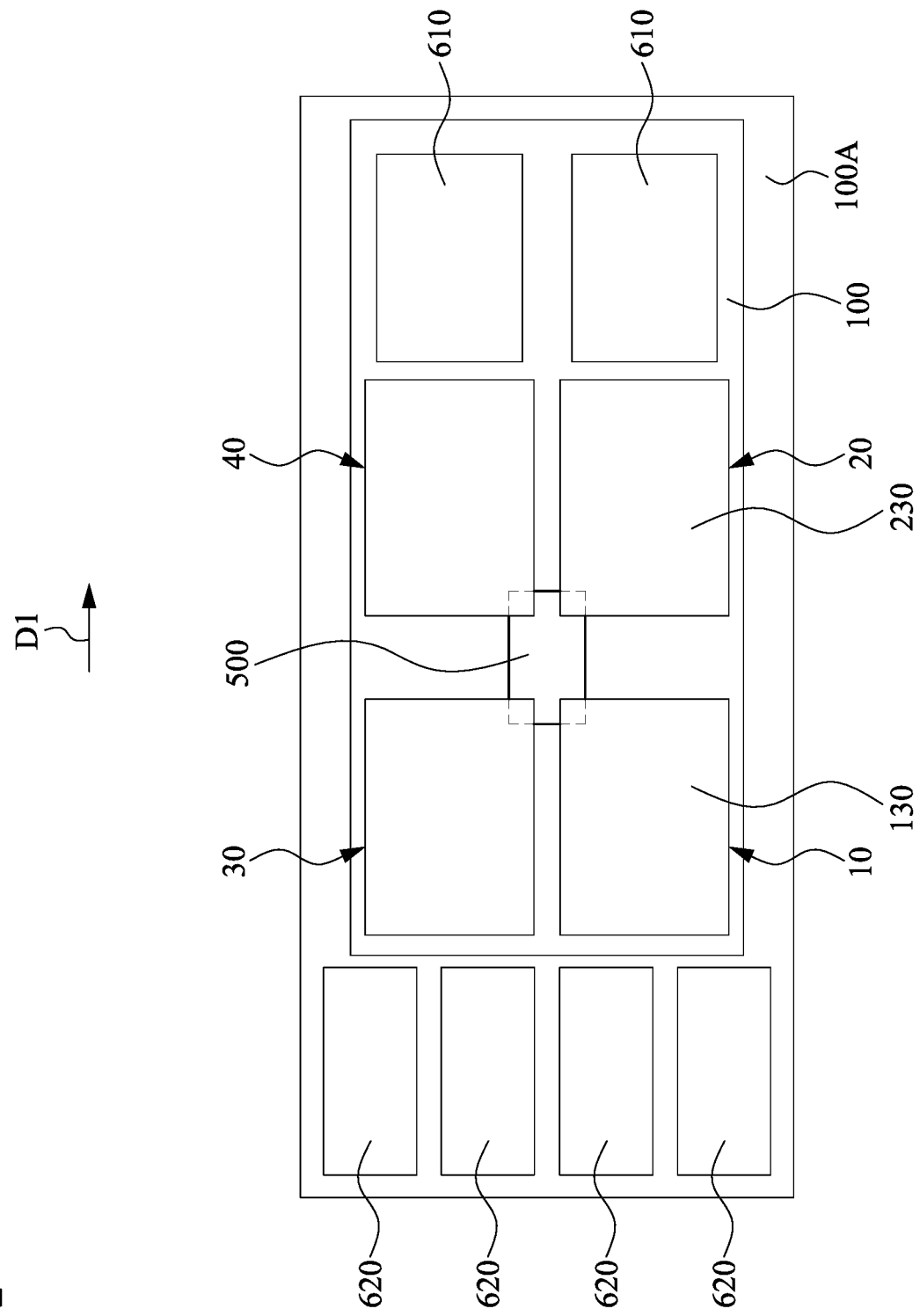
FIG. 2 illustrates a top view of a semiconductor package structure in accordance with some arrangements of the present disclosure.

FIG. 2 illustrates a top view of a semiconductor package structure 1 in accordance with some arrangements of the present disclosure. In some arrangements, FIG. 2 may illustrate a top view of the semiconductor package structure 1 illustrated in FIG. 1A. In some arrangements, FIG. 2 may also illustrate a top view of the semiconductor package structure 2 illustrated in FIG. 1C.

In some arrangements, the semiconductor 1 may include electronic modules 10, 20, 30, and 40 disposed over the substrate 100 along or parallel to direction D2. Each of the electronic modules 30 and 40 may include a structure similar to that of any of the electronic modules described in FIGS. 1A-1C, and thus the description thereof is omitted hereinafter. In some arrangements, portions of the connection element 500 overlap two or more electronic modules (or functional stacks) from a top view perspective. For example, portions of the connection element overlap the electronic modules 10, 20, 30, and 40 from a top view perspective.

In some arrangements, the connection element 500 is configured to control data transmitted between the electronic module 10, the electronic module 20, the electronic module 30, and the electronic module 40 (e.g., the electronic components thereof) without passing the substrate 100. In other words, the connection provided by the connection element 500 to the electronic modules 10, 20, 30, and 40 is different from and external to the substrate 100. In some arrangements, the connection element 500 is configured to transmit data between electronic components in different electronic modules. In some arrangements, the connection element 500 is configured to transmit data between electronic components in different electronic modules and at different elevations with respect to the substrate 100. In some arrangements, the connection element 500 is configured to control transmission paths between the electronic module 10, the electronic module 20, the electronic module 30, and the electronic module 40. In some arrangements, the connection element 500 is configured to control a data rate and/or a bandwidth of one or more transmission paths of data transmitted between electronic components in different electronic modules through the connection element 500 without passing the substrate 100.

Traditionally, the connection element 500 may be omitted, and the signal transmitted between the stacked electronic components would pass through the substrate 100 instead. For example, the signal transmitted from the electronic component 130 to the electronic component 230 may pass through the electronic components 120 and 110, the substrate 100 (e.g., the interconnection structure or redistribution layer within the substrate 100), and the electronic components 220 and 230. In other words, the data transmission path between the electronic components starts from a top of one functional stack (e.g., the electronic module 10) downwards (e.g., from an electronic component to another electronic component immediately below) to and proceeds along the interconnection structure or redistribution layer within the substrate 100, then upwards along the electronic components in another functional stack (e.g., the electronic module from an electronic component to another electronic component immediate above. Such data transmission path between electronic components from different functional stacks is relatively long, which is disadvantageous to high speed data transmission. In contrast, according to some arrangements of the present disclosure, the connection element 500 provides a data transmission path between electronic components from different functional stacks without passing the substrate 100. Therefore, the transmission path can be reduced, and the data transmission rate can be increased significantly.

In addition, according to some arrangements of the present disclosure, with the design of the connection element 500, since the data transmission path does not pass the substrate 100, vertical connections for intra-connecting electronic components from different electronic modules (or functional stacks) can be shortened, which is advantageous to increasing the data transmission rate.

Moreover, according to some arrangements of the present disclosure, the connection element 500 overlaps two or more electronic modules (or functional stacks) from a top view perspective, and thus lateral connections between electronic components from different electronic modules (or functional stacks) can be shortened. As a result, the area utilization of the semiconductor package structure can be increased, and more functionality can be provided in a predetermined area of the semiconductor package structure.

Furthermore, with the design of the connection element 500, in accordance with some arrangements of the present disclosure, the connection element 500 provides an omnidirectional connection for electronic modules (or functional stacks) and is configured to control a data rate and/or a bandwidth of one or more of the transmission paths of data transmitted between electronic components in different electronic modules (or functional stacks). Therefore, the data rates and/or the bandwidths of the transmission paths may be adjusted to satisfy the individual needs of the data transmissions of the electronic components, the data transmission efficiency can be increased and/or optimized, and thus an "intelligence" control over the data transmission characteristics (e.g., data rates, bandwidths of transmission paths, and etc.) of the semiconductor package structure can be achieved.

Figure 3A:
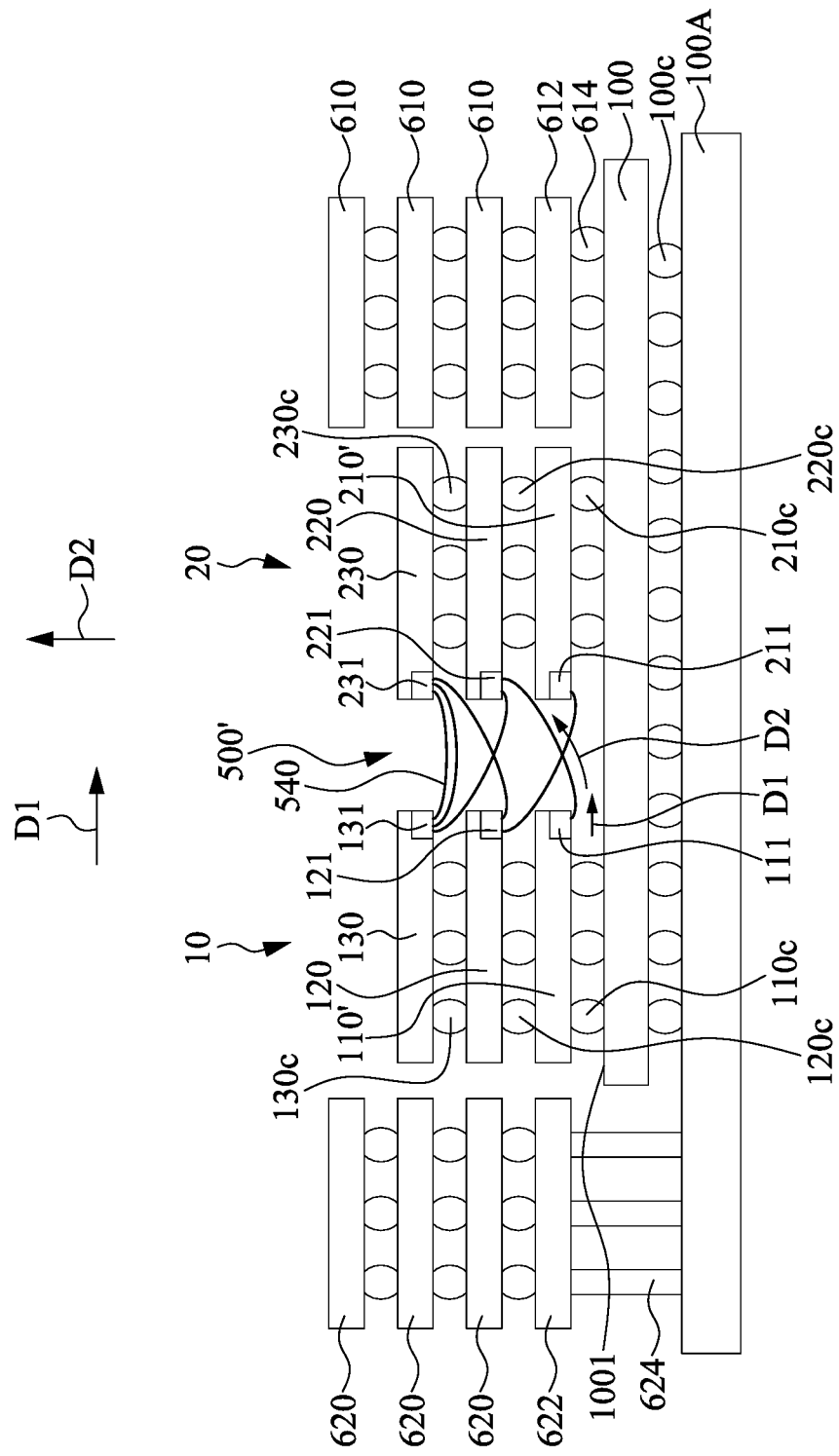
FIG. 3A illustrates a cross-sectional view of a semiconductor package structure in accordance with some arrangements of the present disclosure.

FIG. 3A illustrates a cross-sectional view of a semiconductor package structure 3 in accordance with some arrangements of the present disclosure. The semiconductor package structure 3 is similar to the semiconductor package structure 1 in FIG. 1A except that, for example, the connection element 500' includes a structure different from the connection element 500.

The connection element 500' may include one or more foldable elements or bendable elements that are configured to be structurally flexible. In some arrangements, the connection element 500' includes one or more flexible substrates, one or more bonding wires, one or more optical fibers, or a combination thereof. In some arrangements, the connection element 500' includes a plurality of bridging elements 540 each electrically connecting an I/O module of an electronic component from an electronic module to an I/O module of an electronic component from another electronic module as shown. In some arrangements, each of the bridging elements 540 includes a flexible substrate, a bonding wire, an optical fiber, or a combination thereof.

In some arrangements, the connection element 500 is configured to transmit data between the electronic component 120 and/or 130 and the electronic component 220 and/or 230 at least in the direction D1 and the direction D2. In other words, the connection element 500 is configured to transmit data between the electronic component 120 and/or 130 and the electronic component 220 and/or 230 with corresponding relative positions defined using at least two directions, the direction D1 and the direction D2 In some arrangements, the direction D1 and the direction D2 are not perpendicular and define an angle less than about 180 degrees. In some arrangements, the direction D1 and the direction D2 define an angle greater than about 90 degrees.

In some arrangements, the electronic component 110', which is similar to electronic component 110, may further include an I/O module 111. In some arrangements, the I/O module 111 of the electronic component 110' includes a controller configured to control data transmission between the electronic component 110 and the connection element 500. In some arrangements, the electronic component 210', which is similar to the electronic component 210, may further include an I/O module 211. In some arrangements, the I/O module 211 of the electronic component 210 includes a controller configured to control data transmission between the electronic component 210 and the connection element 500.

In some arrangements, the I/O module 121 of the electronic component 120 includes a controller configured to control data transmission between the electronic component 120 and the connection element 500. In some arrangements, the I/O module 131 of the electronic component 130 includes a controller configured to control data transmission between the electronic component 130 and the connection element 500. In some arrangements, the I/O module 221 of the electronic component 220 includes a controller configured to control data transmission between the electronic component 220 and the connection element 500. In some arrangements, the I/O module 231 of the electronic component 230 includes a controller configured to control data transmission between the electronic component 230 and the connection element 500.

According to some arrangements of the present disclosure, the connection element 500 may include flexible substrates, bonding wires, and/or optical fibers, thus the manufacturing process may be relatively simplified, and the costs may be reduced as well. While the aforesaid improvements may be provided, according to some arrangements, the connection element 500 may be absent an active component or a controller, and each of the I/O modules of the electronic components itself may include a controller configured to control data transmission between the electronic component and the connection element 500. Therefore, the I/O modules of the electronic components may serve the purpose of "intelligence" control over the data transmission characteristics (e.g., data rates, bandwidths of transmission paths, and etc.) between electronic components from different electronic modules (or functional stacks) of the semiconductor package structure.

Figure 3B:
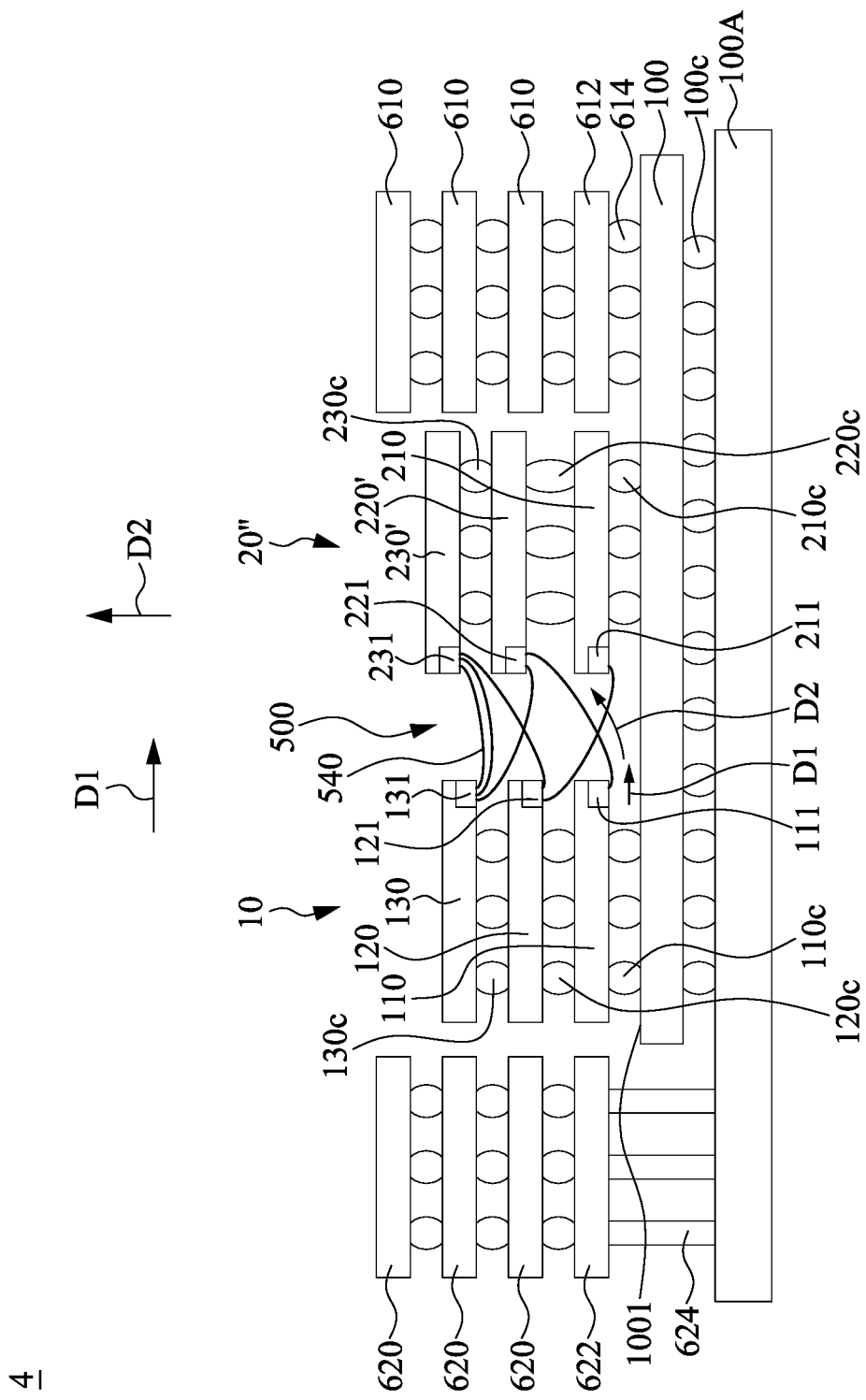
FIG. 3B illustrates a cross-sectional view of a semiconductor package structure in accordance with some arrangements of the present disclosure.

FIG. 3B illustrates a cross-sectional view of a semiconductor package structure 4 in accordance with some arrangements of the present disclosure. The semiconductor package structure 4 is similar to the semiconductor package structure 3 in FIG. 3A except, for example, the functional stack (e.g., the electronic module 20").

In some arrangements, similar to described with respect to FIG. 1C, the electronic component 220' may be at an elevation different from an elevation of the electronic component 120. In some arrangements, the electronic component 120 and the electronic component 220' are arranged side-by-side and at different elevations with respect to the substrate 100. In some arrangements, similar to the electronic component 220' and 120, the electronic component 230' may be at an elevation different from an elevation of the electronic component 130. In some arrangements, the electronic component 130 and the electronic component 230' are arranged side-by-side and at different elevations with respect to the substrate 100.

According to some arrangements of the present disclosure, by adopting the connection element 500 including foldable or bendable elements, the electronic components at different elevations can be directly connected to each other by the connection element 500 without disposing or forming additional interposer connecting elements between the connection element 500 and the electronic component. Therefore, the manufacturing process is relatively simplified, and the costs are reduced as well.

Figure 4:
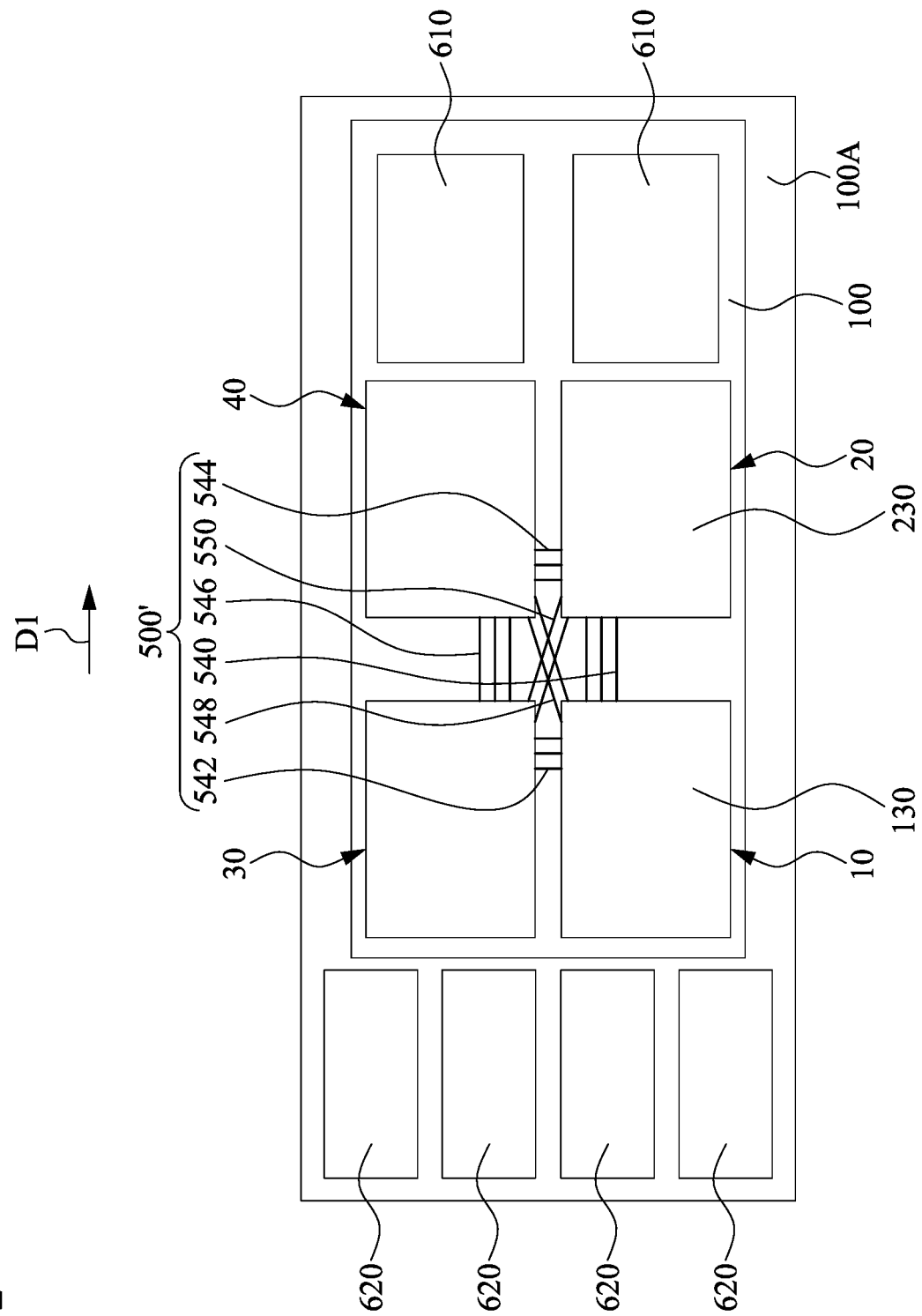
FIG. 4 illustrates a top view of a semiconductor package structure in accordance with some arrangements of the present disclosure.

FIG. 4 illustrates a top view of a semiconductor package structure 2 in accordance with some arrangements of the present disclosure. In some arrangements, FIG. 4 may illustrate a top view of the semiconductor package structure 3 illustrated in FIG. 3A. In some arrangements, FIG. 4 may also illustrate a top view of the semiconductor package structure 4 illustrated in FIG. 3B.

In some arrangements, the connection element 500 may include bridging elements 540, 542, 544, 546, 548, and 550. In some arrangements, each of the bridging elements 540, 542, 544, 546, 548, and 550 electrically connects an I/O module of an electronic component from an electronic module to an I/O module of an electronic component from another electronic module. In some arrangements, the bridging elements 542 electrically connect an I/O module of an electronic component from the electronic module 10 to an I/O module of an electronic component from the electronic module 30. In some arrangements, the bridging elements 544 electrically connect an I/O module of an electronic component from the electronic module 20 to an I/O module of an electronic component from the electronic module 40. In some arrangements, the bridging elements 546 electrically connect an I/O module of an electronic component from the electronic module 30 to an I/O module of an electronic component from the electronic module 40. In some arrangements, the bridging elements 548 electrically connect an I/O module of an electronic component from the electronic module 20 to an I/O module of an electronic component from the electronic module 30. In some arrangements, the bridging elements 550 electrically connect an I/O module of an electronic component from the electronic module 10 to an I/O module of an electronic component from the electronic module 40.

In some arrangements, each of the bridging elements 540, 542, 544, 546, 548, and 550 includes a flexible substrate, a bonding wire, an optical fiber, or a combination thereof. While three bridging elements are included in each set of bridging elements connecting one electronic module to another electronic module as illustrated in FIG. 4, each set can include any number of bridging elements depending over the number of transmission paths required in the semiconductor package structure, and different sets may include different numbers of bridging elements.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   a first electronic component;
   a second electronic component disposed above the first electronic component;
   a third electronic component spaced apart from the first electronic component;
   a fourth electronic component disposed above the third electronic component;
   a connection element electrically connecting the second electronic component to the fourth electronic component;
   a carrier; and
   a first storage element and a second storage element disposed over the carrier, wherein an elevation of a top surface of the first storage element and an elevation of a top surface of the second storage element are higher than an elevation of a top surface of the second electronic component with respect to a surface of the carrier;
   wherein the second electronic component comprises a first processing element, the fourth electronic component comprises a second processing element, and the connection element is configured to adjust bandwidths of a plurality of transmission paths between the first electronic component, the second electronic component, the third electronic component, and the fourth electronic component.

2. The semiconductor package structure as claimed in claim 1, wherein the connection element comprises a first transmission path and a second transmission path substantially perpendicular to the first transmission path.

3. The semiconductor package structure as claimed in claim 1, further comprising a storage element overlapping the connection element and the second electronic component in a direction substantially parallel to the top surface of the second electronic component.

4. The semiconductor package structure as claimed in claim 1, further comprising a storage element overlapping a transmission path of the connection element in a direction substantially parallel to the top surface of the second electronic component.

5. The semiconductor package structure as claimed in claim 1, wherein the first storage element and the second storage element are at two opposite lateral sides of the second electronic component.

6. The semiconductor package structure as claimed in claim 1, wherein the fourth electronic component is disposed between the first storage element and the second storage element.

7. The semiconductor package structure as claimed in claim 6, wherein the elevation of the top surface of the first storage element and the elevation of the top surface of the second storage element is higher than an elevation of a top surface of the fourth electronic component with respect to the surface of the carrier.

8. The semiconductor package structure as claimed in claim 1, wherein the second electronic component at least partially overlaps the connection element in a direction substantially perpendicular to the top surface of the second electronic component.

9. The semiconductor package structure as claimed in claim 1, further comprising a fifth electronic component adjacent to the fourth electronic component, wherein the fifth electronic component comprises a third processing element.

10. A semiconductor package structure, comprising:
    a first electronic component;
    a second electronic component comprising a first I/O module and disposed above the first electronic component;
    a third electronic component spaced apart from the first electronic component;
    a connection element electrically connected to the second electronic component; and
    a first storage element and a second storage element, wherein the second electronic component comprises a first processing element and is disposed between the first storage element and the second storage element,
    a fourth electronic component between the first storage element and the second storage element, wherein the fourth electronic component comprises a second processing element, and an elevation of a top surface of the fourth electronic component is between an elevation of a top surface of the connection element and an elevation of a top surface of the first storage element;
    wherein the first I/O module of the second electronic component comprises a controller configured to control data transmission between the second electronic component and the connection element.

11. The semiconductor package structure as claimed in claim 10, wherein the connection element is between the first storage element and the second storage element.

12. The semiconductor package structure as claimed in claim 11, wherein an elevation of a top surface of the second storage element is higher than the elevation of the top surface of the connection element with respect to a top surface of the first electronic component.

13. The semiconductor package structure as claimed in claim 10, further comprising a fifth electronic component adjacent to the first storage element, wherein the fifth electronic component comprises a third processing element.

14. The semiconductor package structure as claimed in claim 13, wherein the third processing element is disposed between the first storage element and the second storage element.

* * * * *